United States Patent [19]
Hancock et al.

[11] Patent Number: 4,893,914
[45] Date of Patent: Jan. 16, 1990

[54] TEST STATION

[75] Inventors: Robert D. Hancock; Kenneth F. Hollman; Gene A. Porter, all of Carson City, Nev.

[73] Assignee: The Micromanipulator Company, Inc., Carson City, Nev.

[21] Appl. No.: 256,672

[22] Filed: Oct. 12, 1988

[51] Int. Cl.⁴ .................. G02B 21/26; G02B 21/32
[52] U.S. Cl. .................... 350/530; 350/529; 350/531
[58] Field of Search ............ 350/529, 530, 531, 532, 350/533

[56] References Cited

U.S. PATENT DOCUMENTS

| | | | |
|---|---|---|---|
| 515,986 | 3/1894 | Barnard . | |
| 1,859,823 | 5/1932 | Fitz | 350/529 |
| 3,318,593 | 5/1967 | Guernet | 350/530 |
| 3,365,253 | 1/1968 | Haller | 308/190 |
| 3,508,806 | 4/1970 | Hall | 350/531 |
| 3,545,286 | 12/1970 | Stenstrom | 73/517 |
| 3,680,947 | 8/1972 | Wanesky | 350/530 |
| 3,847,452 | 11/1974 | Harder, Jr. | 308/6 R |
| 3,949,295 | 4/1976 | Moorshead | 324/158 F |
| 4,233,740 | 11/1980 | Bunn et al. | 331/1 A |
| 4,343,113 | 8/1982 | Van der Linden | 51/137 |
| 4,367,914 | 1/1983 | Mukasa | 350/530 |
| 4,466,195 | 8/1984 | Herzog | 33/174 L |
| 4,538,885 | 9/1985 | Graham et al. | 350/530 |
| 4,557,568 | 12/1985 | Van Benschoten | 350/531 |
| 4,559,249 | 12/1985 | Arigaya et al. | 428/36 |
| 4,818,169 | 4/1989 | Schram et al. | 350/530 |

FOREIGN PATENT DOCUMENTS 1252667  11/1971  United Kingdom ............... 350/531

OTHER PUBLICATIONS

*The Physics of Experimental Method,* H.J.J. Braddick, Ph.D., John Wiley, New York (1954), pp. 72–75.
*Procedures in Experimental Physics,* Strong et al., New York, Prentice-Hall (1945), pp. 585–592.

*Primary Examiner*—Bruce Y. Arnold
*Assistant Examiner*—Martin Lerner
*Attorney, Agent, or Firm*—Fitch, Even, Tabin & Flannery

[57] ABSTRACT

A test station for use in evaluating semiconductor chips and the like. The test station has improved components for supporting and adjusting the positions of a microscope and stage relative to a base surface which supports a plurality of probes.

17 Claims, 8 Drawing Sheets

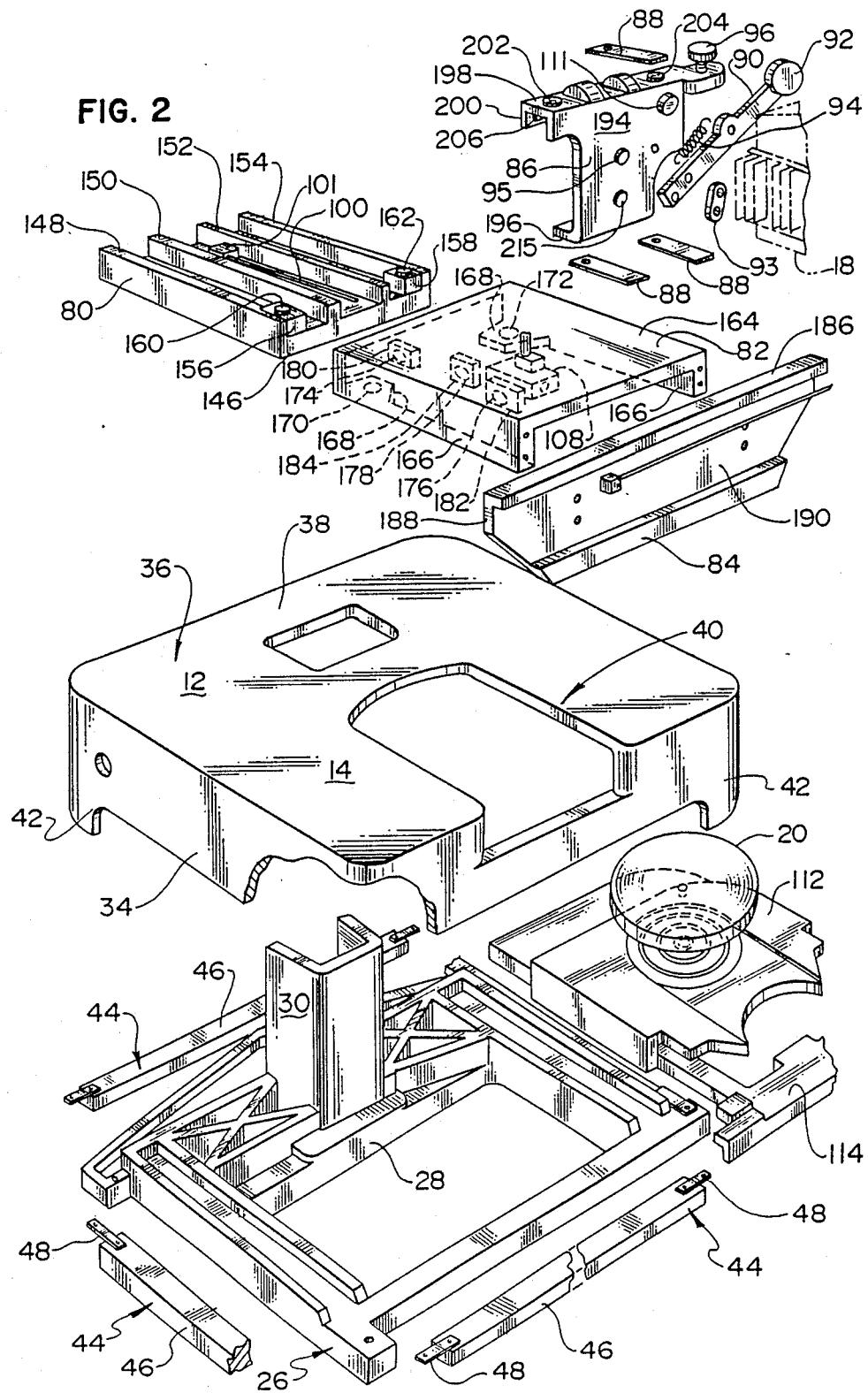

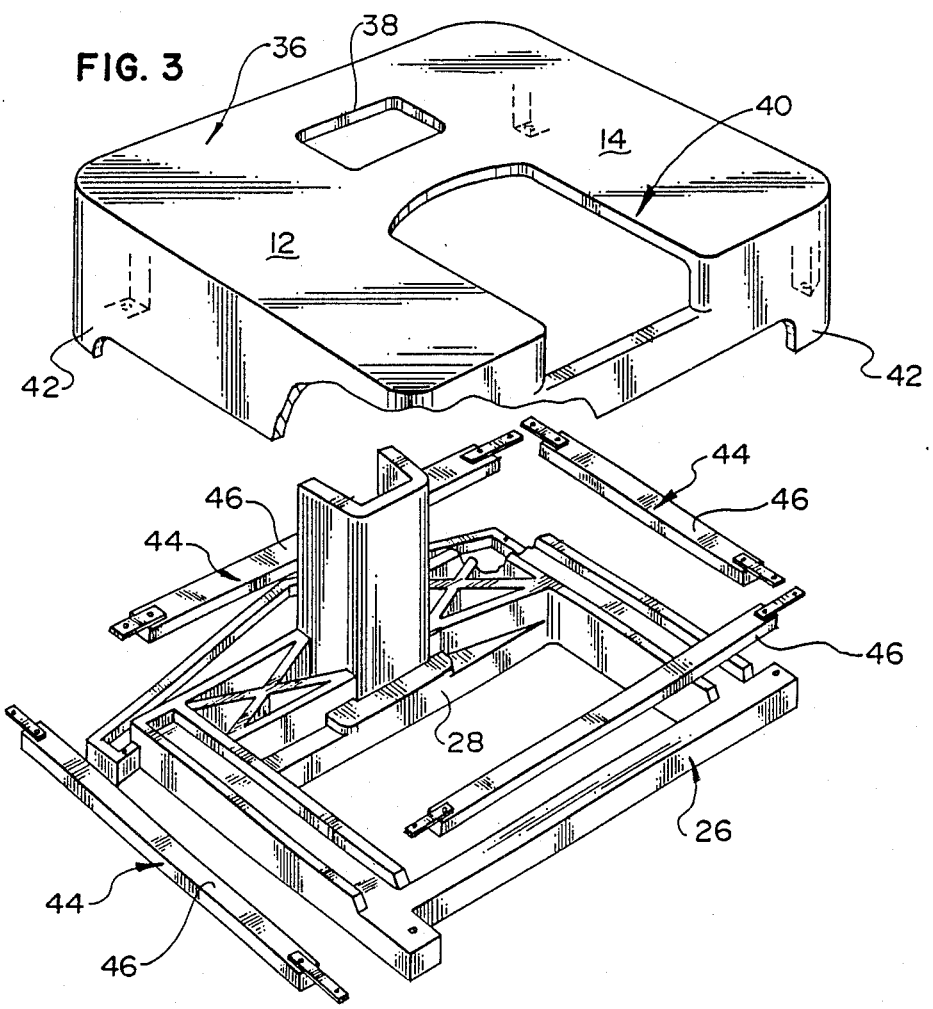
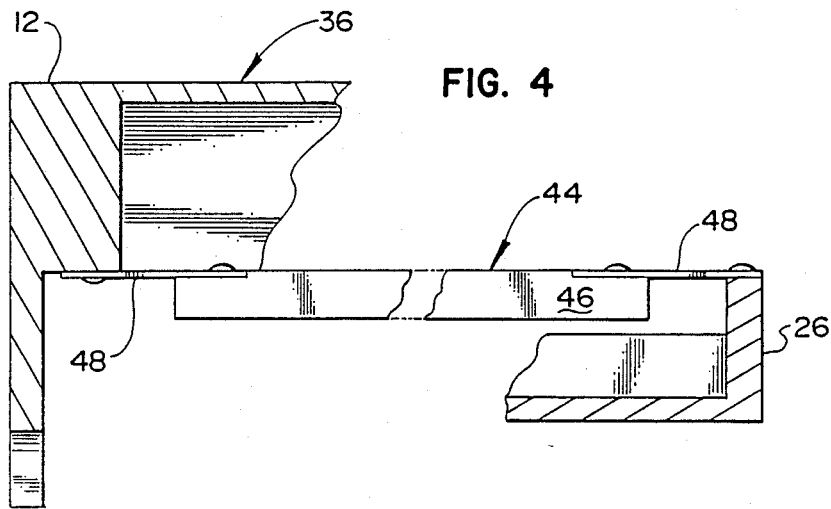

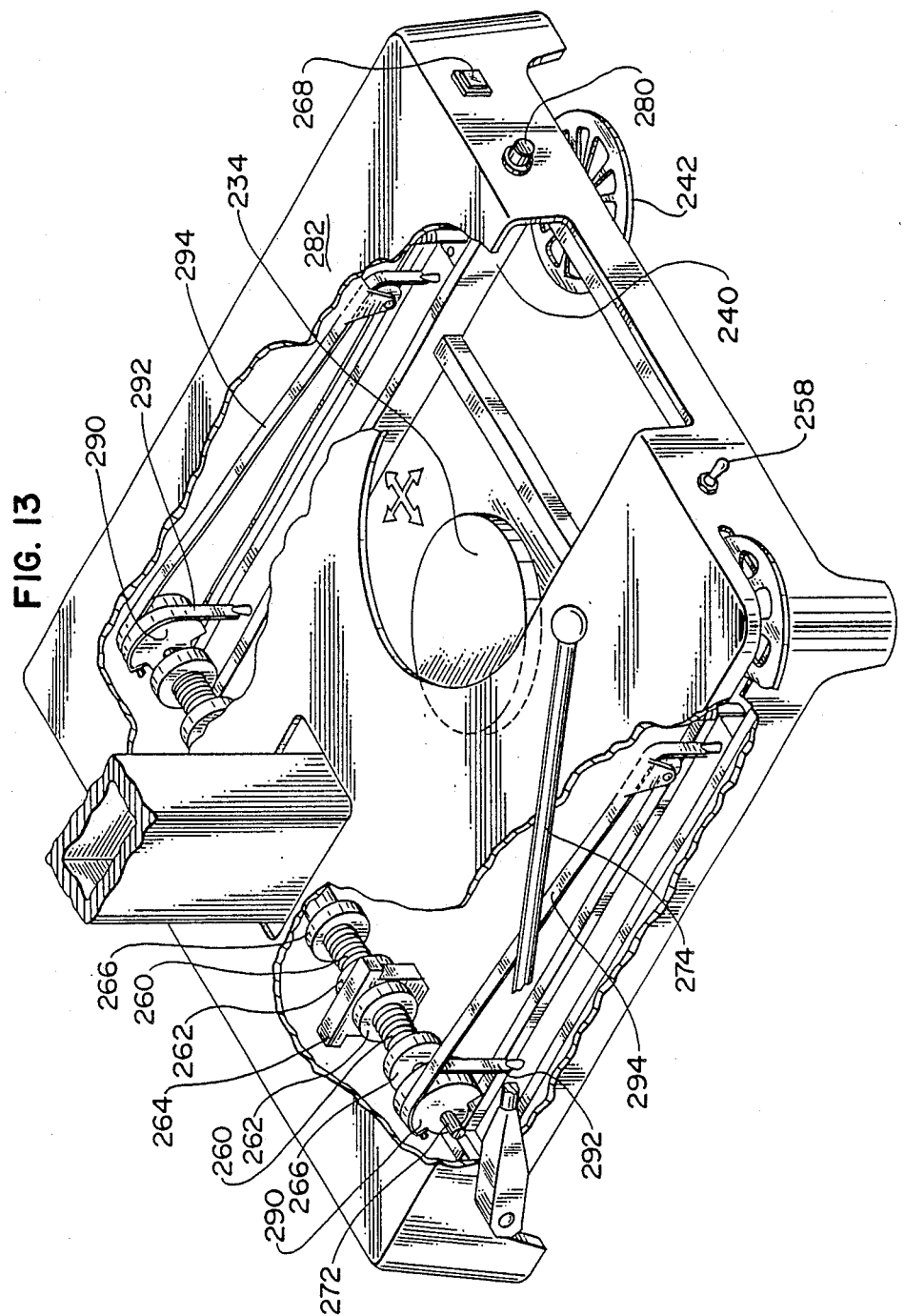

TEST STATION

BACKGROUND OF THE INVENTION

The invention relates to a test station for electronic testing of semiconductor chips and the like.

A test station of the type to which the invention relates typically includes a stage on which a test object is placed for observation, a microscope for viewing the test object, a plurality of probes for making electrical contact with the test object at various points, and means for adjusting the positions of the stage, microscope and probes relative to one another. It is desirable that the mechanisms for adjusting the positions of the components be substantially free of play and lost motion to enable the operator to make precise adjustments as small as a fraction of a micron.

In the past, mechanisms for adjusting the relative positions of components in test stations have typically involved rack-and-pinion or lead screw mechanisms in combination with sliding dovetail arrangements. One disadvantage of such mechanisms is that they require precision components with extremely low tolerances which are relatively difficult and expensive to manufacture. Another disadvantage is that, over an extended period of time, particulate matter may collect in the dovetail slide channels, increasing friction between relatively-moving components. Test stations of the type to which the present invention relates are commonly used in laboratories for analysis of silicon chips, and small particles of silicon are frequently present in the laboratory environment. Collection of such particles between sliding surfaces increases friction and wear on the surfaces, thereby interfering with adjustment of components and with maintenance of precise control over the positions of the components.

Accordingly, one of the problems addressed by the present invention is the provision of precision mechanisms which can be manufactured reasonably economically and which are not overly susceptible to wear in the presence of environmental contamination.

Another consideration is the susceptibility of the test station to vibration or other minor deflections resulting from external physical disturbances. In a typical laboratory setting, where the test station is supported on a laboratory bench, very minor physical disturbances, e.g., vibrations resulting from workers walking on areas of the floor near the bench, may potentially cause vibrations of sufficient magnitude to interfere with cause severe interference with viewing, and maintenance of a high degree of precision in positioning of a test object and probe tips. Accordingly, it is desirable that the individual structural components be relatively stiff, and that they fit together in such a manner as to minimize relative displacements between the components due to externally-induced stresses and strains.

Additional considerations addressed by the present invention include the provision of structural components which can be manufactured relatively economically, and which can be assembled without unduly complicated procedures; and provision for relative ease of operation and maintenance of the test station.

A general object of the invention is to provide improved mechanisms for movably supporting and adjusting test station components. Further objects of the invention will become apparent from the following description and accompanying drawings.

SUMMARY OF THE INVENTION

The invention provides an improved test station having a novel means for stably supporting a stage, a microscope and a plurality of probes; and improved means to provide precise three-dimensional control of the positions of the stage and microscope with improved, kinematically designed adjustment mechanisms.

In accordance with one aspect of the invention, the test station has a base which is rigid and fixed, and provides a stable, horizontal surface for supporting the probes; and the microscope and stage are both supported by a movable frame which is movable vertically relative to the base, so that the microscope and stage may be moved as a single unit relative to the base.

In accordance with another aspect of the invention, the frame includes a lower portion which supports the stage and is disposed beneath the mounting surface of the base, and a post which extends upwardly through an opening in the mounting surface of the base to support the microscope. The stage is accessible through an opening near the front of the mounting surface of the base.

In accordance with a further aspect of the invention, horizontal movements of the microscope and stage are controlled by friction rod drives, wherein a friction rod is driven in rectilinear motion along its axis by rollers. The roller in each friction rod drive preferably has a groove engaging the friction rod. The groove preferably defines an included angle of about 15°.

In accordance with another aspect of the invention, the frame is permitted to move vertically in rectilinear motion while constrained against horizontal translation and against rotation in a horizontal plane by a novel suspension system which comprises a plurality of location bar assemblies. Each of the location bar assemblies is attached at one end to the frame and at an opposite end to the base. The connections at the ends of each location bar assembly enable it to pivot slightly relative to the frame and base.

A further aspect of the invention is that kinematic constraint of components which slide relative to one another is provided by the use of slide pads, or linear bearings, in combination with gravity preloading, rather than dovetail slide and groove arrangements, or sliding collars on rods.

In accordance with an additional aspect of the invention, the frame is lowered and raised by a pulley mechanism which employs metal ribbons to support the frame.

Further aspects of the invention will become apparent from the detailed description of the preferred embodiment of the invention.

BRIEF DESCRIPTION OF THE DRAWINGS

FIG. 2 is an exploded view of the test station of FIG. 1 with certain components being broken away or omitted for clarity.

FIG. 3 is an exploded perspective view of the base and frame of the test station of FIG. 1, illustrating the suspension arrangement by which the frame is movably supported on the base for vertical rectilinear travel relative thereto.

FIG. 4 is a foreshortened elevational view, taken partially in section, illustrating a portion of the suspension system which connects the movable frame to the base.

FIG. 13 is a perspective view of the lower portion of the test station of FIG. 11, shown with various portions broken away or omitted for purposes of clarity.

DETAILED DESCRIPTION OF THE PREFERRED EMBODIMENT

Introduction

Figure 1:
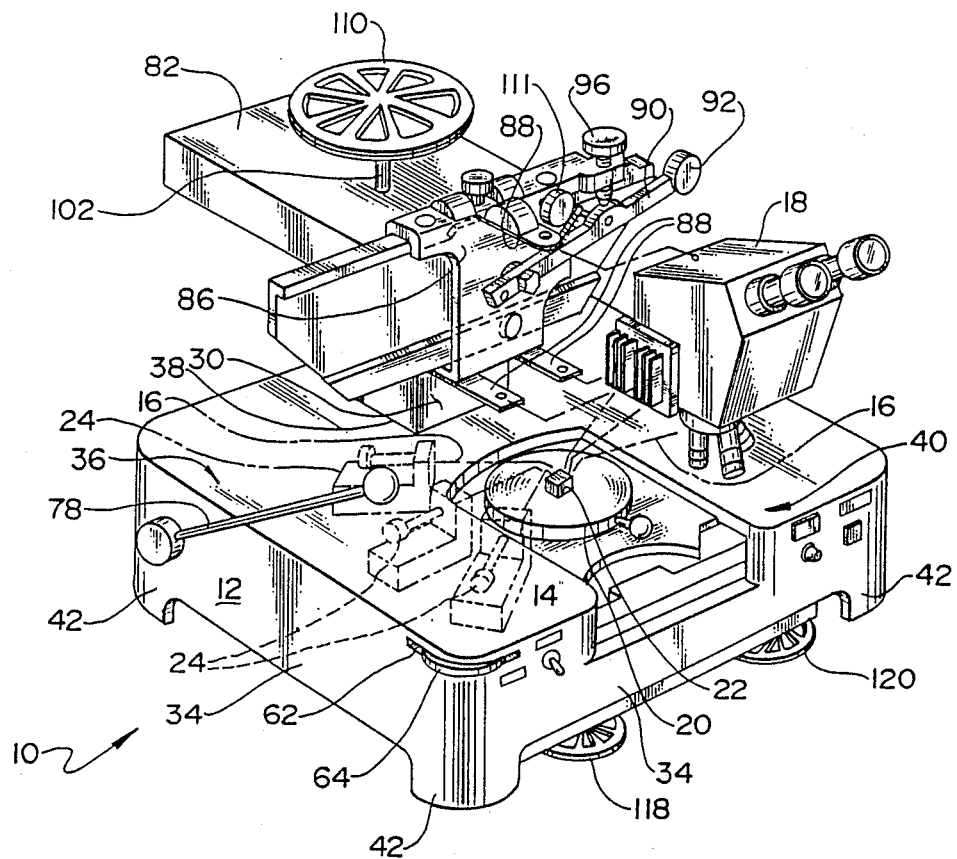
FIG. 1 is a perspective view of a test station in accordance with the invention, shown with the microscope removed for the purposes of clarity.

The invention is preferably embodied in a test station 10 which includes a base 12, a microscope 18 supported above the base 12, and a stage 20 for supporting an object 22 viewed through the microscope 18. The base includes a relatively large, flat fixed surface 14 for mounting of a plurality of probes 16. The stage 20, probes 16 and microscope 18 are each independently adjustable in three dimensions. Adjustment of the probes 16 is made possible by providing each of the probes with a micromanipulator 24. Micromanipulators which are presently commercially available are suitable for this purpose, and the structure and operation of these devices will not be discussed in detail herein. Adjustment of the positions of the microscope 18 and stage 20 is effected by mechanisms described below.

To appreciate the advantages provided by the test station 10, an example of a typical use of the test station may be helpful. One use for the test station is failure analysis of microelectronic circuits or "dice" which are arranged in an array on a wafer. Testing of such dice involves placement of a plurality of probes in a predetermined configuration on each of the dice to make electrical contact with specific elements of each die individually. After each die is tested, the probe tips are lifted from the die, or the die lowered relative to the probe tips, so that the wafer can be displaced horizontally to bring an adjacent die into position for testing. Once the adjacent die has been displaced horizontally, the probe tips are brought into contact with it. Precise horizontal adjustment of the position of the wafer relative to the probe tips is necessary to enable the probe tips to contact each successive die at the proper points, and precise vertical adjustment is necessary to provide contact between the die and the probe tips without excessive pressure therebetween. Excessive pressure may cause the probe tips to skate, or be displaced horizontally, from their correct positions. As described in detail below, the test station 10 provides mechanisms which enable both coarse and fine adjustments of both vertical and horizontal stage position to be made with precision.

During testing of a particular circuit, it may be desirable to examine different parts of the circuit while maintaining contact between the probes and the test object. Under very high magnification, the field of view of the microscope is relatively small, and horizontal displacement of the microscope relative to the stationary probes may be necessary to enable observation of all of the desired areas of the test object. Accordingly, the test station 10 enables precise adjustment of the position of the microscope, in addition to enabling precise adjustment of the position of the stage.

To facilitate description of the illustrated test station 10, rectilinear displacement will be referred to in terms of the X, Y and Z axes. Referring to FIG. 1, the forward side of the test station is that on which the eyepieces of the microscope 18 are located, and the terms "left" and "right" are used with reference to a person standing in the user's position, in front of the test station and facing it. The X axis will refer to the left-to-right direction; the Y axis will refer to the forward-to-rear direction; and the Z axis will refer to the vertical direction.

Base and Frame

In accordance with a feature of the invention, the microscope 18 and stage 20 are supported on a movable frame 26 which is movable along the Z axis relative to the base 12 so that the microscope 18 and stage 20 can be moved together, i.e., as a unit, along the Z axis while the probes 16 remain fixed, thus permitting the test object 22 to be removed from contact with the probes 16 while remaining in focus as viewed through the microscope 18. Once the test object has been lowered, the stage can be moved in a desired horizontal direction until the test object reaches the next desired position. When the object is subsequently raised back to its initial elevation to contact the probes 16, the tips of the probes return to focus, and contact the test object at the same pressure as they previously contacted it, without the necessity of any fine adjustments.

The frame 26 includes a generally rectangular, generally horizontal lower portion 28 for supporting the stage 20 and a post 30 extending upwardly from the rear of the lower portion 28 for supporting the microscope 18.

The base 12 includes a substantially horizontal top wall 36 providing the mounting surface 14 for the probes 16, and four generally vertical side walls 34 extending downwardly therefrom about its periphery, comprising forward and rear walls and a pair of side walls. The top wall 36 of the base has a rearward opening 38 formed therein through which the upwardly-extending post 30 of the frame 26 extends, and a forward opening 40 to provide access to the stage 20. Legs 42 are provided at each corner of the base 12 for supporting it on a table or a bench in the laboratory.

Both the base 12 and the frame 26 are preferably integral, one-piece castings made of a suitable high-strength, lightweight material. Both have relatively thin walls in order to facilitate precise casting and for purposes of economy, and are provided with reinforcing ribs which provide the structural stiffness required to limit vibration of components due to external disturbances. The post 30 is channel-shaped, comprising a vertical front wall and a pair of side walls extending rearwardly therefrom. The side walls are not parallel, but rather are slightly divergent proceeding rearward.

The frame 26 is preferably constrained against translation and rotation in the horizontal plane by four elongate location bar assemblies 44. Each assembly in the embodiment of FIGS. 1–10 comprises a substantially rigid central bar 46 and a pair of leaf springs 48 fixedly mounted on and extending longitudinally outward from opposite ends of the bar 46. In other embodiments, each assembly may employ ball joints or the like at its opposite ends rather than leaf springs. Each of the location bar assemblies 44 has one of its ends fixed to a downwardly-facing surface on the base 12 and the other to an upwardly-facing surface on the frame 26. The frame has four such upwardly-facing surfaces, one near each corner, and the base has four similarly disposed downwardly-facing surfaces. Three of the surfaces on the frame are located on three respective lugs protruding outward to the left at the left-rear corner; forward at the left-front corner; and outward to the right at the right-front corner. The fourth, at the right-rear corner, is located on a triangular rear portion of the frame having a recess to accommodate the associated support member.

The location bar assemblies 44 are arranged in a generally rectangular configuration, with each assembly 44 extending parallel and adjacent to a respective side of the frame 26, and being substantially equal in length to the adjacent side of the frame. Proceeding in a clockwise direction around the test station as viewed in plan, each assembly 44 extends from the base to the frame. This configuration optimizes use of available space within the confines of the base 12 to permit employment of relatively long location bar assemblies 44 so that rotation of the frame 26 in a horizontal plane as a result of vertical displacement is minimal. The location bar assemblies thus provide precise stabilization of the frame to maintain its horizontal position and orientation through a range of vertical positions. The location bar assemblies also avoid friction as would result from sliding engagement between the frame and base.

Frame Positioning Mechanisms

The vertical position of the frame 26 is controlled by a coarse adjustment mechanism 52 which enables rapid vertical displacement of the frame, and a plurality of adjustable stops 50 which limit upward travel of the frame and enable fine adjustments to be made. In the preferred embodiment, three stops 50 are provided, one near each of the forward corners of the base, and one near the center behind the rear opening. Each stop 50 comprises a vertically oriented threaded shaft 54 which is rotatably supported in a threaded bore 56 on the base 12 so that rotation about a vertical axis effects vertical displacement.

The coarse adjustment mechanism 52 biases the frame 26 upwardly against the stops. Fine adjustment of the frame position may be effected by rotating the stops 50. To effect synchronized and uniform vertical displacement of all of the stops 50, the threads on the various stop shafts 54 are of substantially identical pitch, and means are provided to synchronize rotation thereof. Synchronization of rotation is preferably effected by providing each of the stop shafts 54 with a respective sprocket 58 and providing a timing chain 60 engaging each of the sprockets.

To leave the front-center portion of the base uncluttered and avoid interference with the stage, the timing chain 60 extends rearwardly behind the opening in the base rather than extending directly between the forward stops. Inner and outer idler sprockets 61 near the rear corners of the base guide the timing chain 60. To facilitate manual rotation of the stops 50, a slot 62 is provided in the left forward corner of the base 12 and an adjustment wheel 64 affixed to the adjacent stop shaft 54 has a peripheral edge portion extending therethrough. The edge of the wheel 64 is preferably toothed or otherwise provided with a rough surface to facilitate manual engagement thereof.

The coarse Z adjustment mechanism 52 exerts upward force on the frame via a plurality of metal ribbons 66, each having one end attached to the frame 26 and an opposite end attached to a drum 68 on a manually-rotatable horizontal shaft 70 which extends along the Y axis between the side walls of the base. In the illustrated embodiment, the ribbons 66 are four in number, and each is attached to the frame 26 near a respective stop 50 so as to limit the magnitude of bending moments on the frame 26 due to the upward biasing. The ribbons 66 which are attached near the forward corners of the frame 26 extend from drum 68 on the manually-rotatable horizontal shaft 70 forwardly over guide rollers 72 rotatably mounted near the forward corners of the base 12, and forwardly downward to the frame 26. The third and fourth ribbons 66 extends directly downward from the drums 68. Each of the ribbons 66 is pinned to its associated drum 68, and the drums 68 are fixed to the shaft. The shaft is journaled on bearings mounted on the side walls of the base.

In the embodiment of FIGS. 1–10, the biasing force which urges the frame 26 upward is provided by a pair of coil springs 74 loaded in tension. Each has a forward end attached to the forward side wall of the base and a rearward end attached to a crank arm 76 that extends downwardly from the shaft 70. To facilitate manual rotation of the shaft 70, a relatively long handle 78 extends radially outward from the shaft 70 on one end thereof outside of the confines of the base walls. When the shaft is rotated clockwise as viewed in FIG. 9 by applying downward force to the handle 78, the biasing force is overcome and the frame 26 is lowered. To provide a lower position of mechanical equilibrium for the frame 26, the orientation of the crank arms 76 and the spring constant are related such that the shaft 70 may be rotated sufficiently to shorten the length of the effective moment arm through which the springs 74 apply torque to the shaft 70, so that the torque applied to the shaft by the springs 74 is less than the torque applied to the shaft 70 by the weight of the frame 26 acting through the ribbons 66.

Microscope Positioning Mechanisms

The microscope 18 is supported on the post 30 for three-dimensional movement relative thereto. Affixed to the top of the post is a first track 80 (hereinafter, the "Y track"). A first slide 82 (the "Y slide") is supported for rectilinear movement along the Y axis on the Y track 80.

A second track 84 (the "X track") is affixed to the forward end of the Y slide 82, and a second slide 86 (the "X slide") is slidably mounted on the X track 84 for rectilinear travel along the X axis. The microscope 18 is supported on the X slide 86 and constrained against horizontal movement relative thereto by three leaf springs 88.

Coarse vertical or Z-axis movement of the microscope 18 is controlled by a lever arm 90 which is pivotally mounted on the X slide 86. The lever arm 90 has a handle 92 at one end and is connected to the microscope 18 at its opposite end by a link 93 (FIG. 2). The pivot point 95 of the lever arm is located between the handle and the microscope so that movement of the microscope is opposite in direction to movement of the handle. To provide upper and lower equilibrium positions for the microscope 18, a pivotally-mounted compression spring assembly 94 has a first end pivotally mounted on the X slide 86 and a second end pivotally connected to the lever arm 90. This provides an over-center biasing arrangement for the lever arm, biasing the microscope 18 upward when it is in its upper equilibrium position and downward when it is in its lower equilibrium position.

The precise elevation of the lower equilibrium position of the microscope 18 is determined by a vertically-adjustable stop 96. The stop 96 comprises a screw extending vertically through a threaded bore on the X slide 86. Its lower end engages the lever arm 90 near the handle 92 when the microscope is in its lower equilibrium position. Thus, when the microscope is in its lower equilibrium position, fine vertical adjustments of the lower equilibrium position, for the purpose of focusing, may be made by rotation of the stop 96.

The lever arm 90 thus may be pushed downwardly to raise the microscope 18 when it is desired to provide clearance above the stage 20 for replacement of the test object 22 or the like, and the microscope 18 may subsequently be lowered to its original position, simply by raising the handle 92 until the arm 90 abuts the stop 96. Where a number of test objects of identical configuration are being tested in sequence, this feature eliminates any need for refocusing the microscope between objects.

The Y track 80 comprises a substantially horizontal, substantially planar bottom wall 146 having four elongated ribs 148, 150, 152 and 154 extending upwardly therefrom parallel to the Y axis. At the forward corners of the Y track 80 are a pair of blocks 156 and 158 having slide pads or linear bearings 160 and 162 thereon. The slide pads 160 and 162 bear on a lower surface of the Y slide 82.

Three of the ribs 148, 152 and 154 are relatively thin, and serve primarily to stiffen the wall 146. One of the ribs 150 is thicker so that it can be used to cooperate with three slide pads on the Y slide 82 as explained below.

The Y slide 82, comprises a substantially planar and horizontal upper wall 164, a pair of vertically-oriented side walls 166 extending downward therefrom along opposite edges thereof parallel to the Y axis, and a pair of lugs 168 extending inwardly at the rear lower corners of the side walls 166 and having slide pads 170 and 172 mounted on their upper surfaces. These slide pads 170 and 172 engage the lower surface of the horizontal wall 146 of the Y track 80. The weight of the microscope 18 applies downward force to the forward end of the Y slide 82, thus applying downward force to the pads 160 and 162 at the forward end of the track 80, and applying upward force to the rear of the track 80 through the slide pads 170 and 172 on the lugs at the rear of the slide 82.

On the underside of the Y slide are provided three vertically-oriented slide pads 174, 176 and 178 mounted on respective blocks 180, 182 and 184. Pads 174 and 176 engage one side of the rib 150 on the Y track 80, and the third 178 for engaging the opposite side of the rib 150, the third pad 178 being disposed between the first two with respect to position along the Y axis. These pads 174, 176 and 178 constrain the Y slide 82 against rotation in a horizontal plane and against movement in the X direction relative to the Y track 80.

The X track 84 is fixed to the forward end of the Y slide 82. The X slide 86 bears on the upper surface 186, an upper portion of the back surface 188, and a lower portion of the front surface 190 of the X rack through slide pads. In the preferred embodiment, the X slide 86 has a substantially vertical front wall 194, substantially horizontal bottom and top walls 196 and 198 extending rearwardly therefrom, and a substantially vertical back wall 200 extending downwardly at the rear of the top wall 198. Two pairs of slide pads are provided near the top. One pair 202, 204 is mounted in the top wall of the slide. The other pair, of which one is indicated at 206, is mounted in the back wall 200 of the slide 86. A single pad 210 is provided near the bottom of the front wall 194 of the slide 86. All of the aforementioned pads are installed so as to extend entirely through the slide, thereby being readily accessible from the exterior for purposes of injection of lubricant as explained below.

To enable smooth sliding contact between the X track 84 and the slide pads on the X slide 86, the upper portion of the back surface 188, the upwardly-facing top surface 186, and the lower portion of the front surface 190 of the X track 84 are all substantially planar and machined so as to be relatively smooth.

The Slide Pads

Each of the preferred slide pads is generally disk-shaped, having substantially planar end surfaces and a substantially circular cylindrical peripheral surface. The substantially circular peripheral surface 134 pushes aside dust and the like as the slide pad travels along a support surface, preventing buildup of such materials on the path of the slide pad, and minimizing introduction of such material into the frictional contact between the slide pad and its associated support surface. The slide pads typically bear on an aluminum support surface.

In the preferred embodiment of the invention, the slide pads are made of graphite-filled Teflon. This material has low coefficients of friction when in contact with aluminum, both in static and dynamic contexts.

Figure 5:
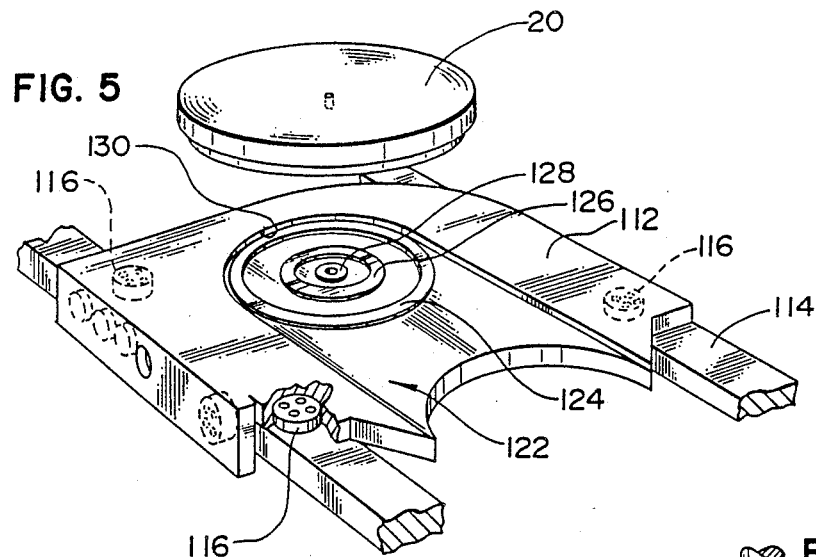
FIG. 5 is a perspective view of the stage and associated components of the test station of FIG. 1.

In another embodiment, slide pads as shown in FIG. 5 are employed. Each slide pad has at least one cavity formed therein to supply lubricant to its bearing surface. To facilitate replenishing of lubricant, an access port extends from each cavity to an externally accessible location. The access port is filled with a rubber plug or the like so that refilling may be accomplished by piercing the plug with a hypodermic needle and injecting lubricant with a syringe. When the needle is withdrawn, the resiliency of the plug seals the hole made by the needle.

The Friction Rod Drives

Figure 6:
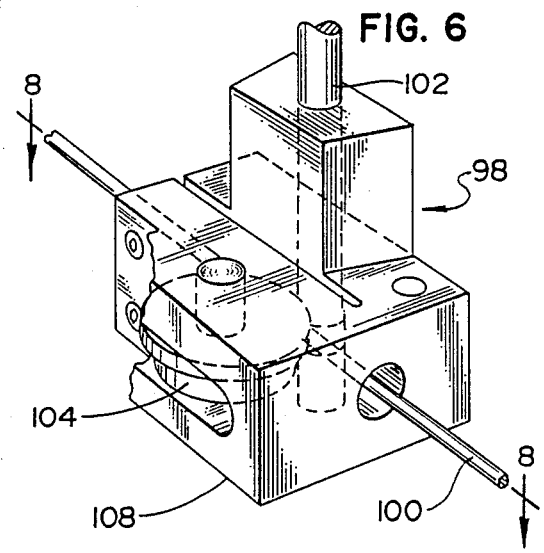
FIG. 6 is a perspective view illustrating one of the friction rod drives of the apparatus of FIG. 1.
Figure 7:
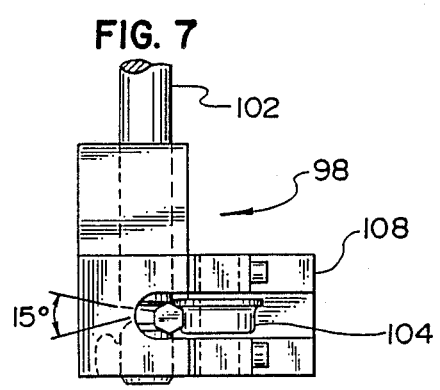
FIG. 7 is an elevational view of the friction rod drive of FIG. 6.
Figure 8:
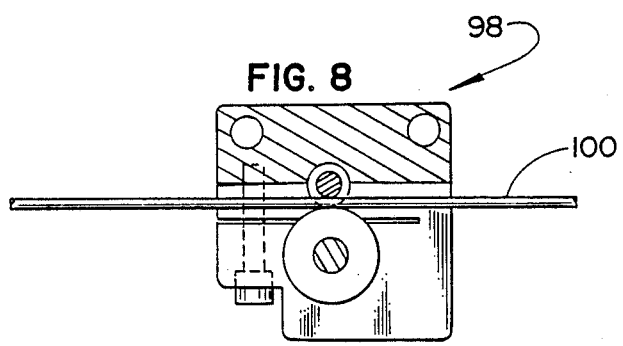
FIG. 8 is a sectional view taken substantially along line 8—8 in FIG. 6.
Figure 9:
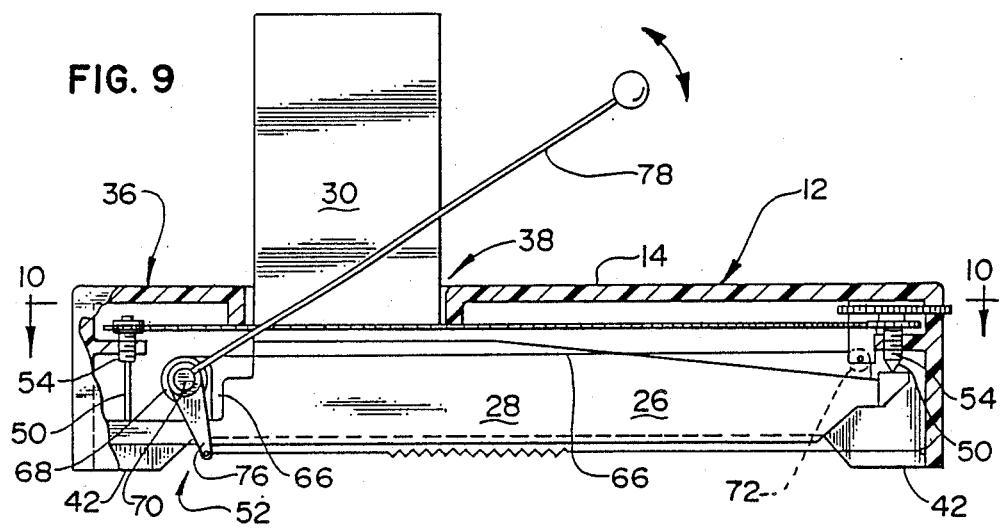
FIG. 9 is a partly diagrammatical elevational view illustrating the means for adjusting the vertical position of the movable frame relative to the base.
Figure 10:
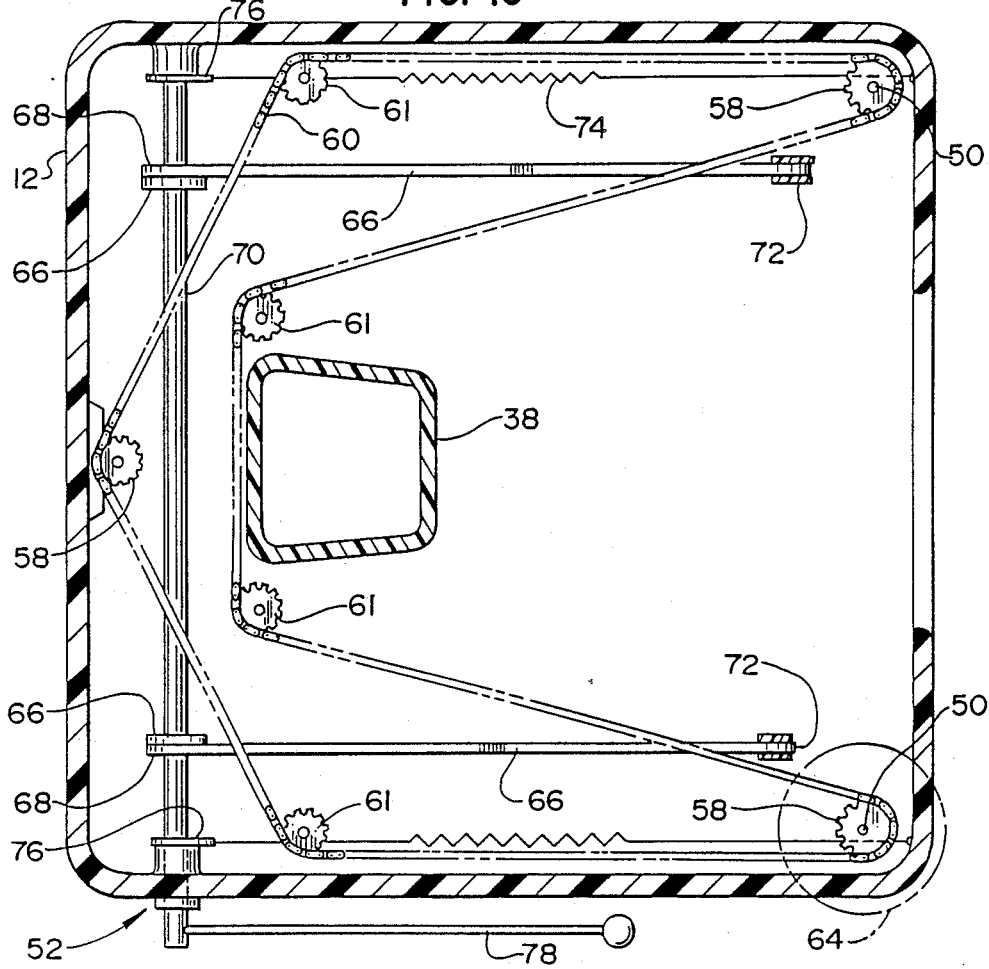
FIG. 10 is a sectional view taken substantially along line 10—10 in FIG. 9, illustrating the base and the adjustment mechanism mounted thereon.

To enable precise adjustment of the slides 82 and 86 relative to their respective tracks 80 and 84, friction rod drives 98 and 99 are provided for each slide and track pair. FIGS. 6–8 illustrate the friction rod drive 98 for translation of the Y slide 82, which is typical of the friction rod drives.

Referring to FIGS. 6–8, 11a, friction rod drive 98 comprises a long thin rod 100 which extends parallel to the Y axis and is mounted on a block 101 (FIG. 2) fixed to the track 80, and a rotating shaft 102 which frictionally engages the rod 100 in rolling contact. The rod 100 is biased toward the shaft 102 by a wheel 104 disposed adjacent the shaft 102 on a parallel axis and rotatably mounted in a common housing 108 therewith. The housing 108 is mounted on the slide 82. The shaft 102 has an annular groove 106 therein to prevent transverse movement of the rod 100. The groove 106 preferably defines an included angle of about 15° as indicated in FIG. 7.

Referring to FIG. 1, the shaft 102 of the friction rod drive 98 which controls movement of the Y slide 82 is provided with a relatively large control wheel 110 which facilitates manual adjustment of the position of the microscope along the Y axis. A smaller knob 111 is provided for the friction rod drive 99 and disposed in close proximity to the Y control wheel 110 so as to facilitate one-handed adjustment of the microscope position.

Stage and Stage-Positioning Mechanisms

The stage 20 is generally disk-shaped and is supported on a movable stage platform 112. The stage platform 112 is supported by a carriage 114. The stage platform 112 is slidable relative to the carriage 114 along the Y axis and is supported for sliding movement thereon by a plurality of slide pads 116. Similarly, the carriage 114 is itself supported on slide pads for movement along the X axis relative to the frame 26.

The carriage is a generally rectangular, frame-like structure which includes forward and rearward members extending parallel to the X axis, connected by left and right side members extending parallel to the Y axis. The forward member defines a downwardly-opening channel for receiving the forward member of the frame 26. A first pair of slide pads are disposed on the forward wall of the channel, a second pair on the upper wall, and a single slide pad disposed on the rear wall of the channel, to engage the forward member of the frame 26 in sliding contact.

The rear member of the carriage has a single slide pad thereon engaging a substantially planar, upwardly-facing bearing surface on the frame 26 immediately forward of the upwardly-extending post. The rear member of the carriage tapers downwardly in width proceeding from left to right.

Like the frame 26, the carriage 114 has a large, substantially rectangular central opening to provide unrestricted access to the underside of the stage platform for vacuum hoses and the like.

The stage platform comprises a substantially planar, substantially horizontal top wall and a short side wall which depends therefrom along its left side. As illustrated in FIG. 5, the stage platform employs three slide pads for supporting its weight on the carriage, two engaging the left side member of the carriage and one engaging the right side member. It also has a plurality of slide pads mounted on its side wall to engage the left side carriage member on the outside facing surface thereof, and has an opposing slide pad engaging the inwardly facing surface of the left side member of the carriage.

The latter slide pad is preferably adjustable so that its position with respect to the X axis may be varied, as for example by an adjustment screw. Preferably, a threaded block is provided on the underside of the stage platform, and the adjustment screw extends therethrough parallel to the X axis for adjusting the position of the slide pad.

The carriage and stage platform are each preferably integral, one-piece castings. Friction rod drives similar to those described above with respect to the microscope adjustment means are employed for adjusting the X and Y positions of the stage. The control wheels 118 and 120 for these drives protrude from beneath the front wall of the base 12 for convenient access.

A vacuum arrangement secures the stage 20 in position on the stage platform 112. To this end, the stage platform 112 has three concentric raised rings, 124, 126 and 128 formed thereon, the middle ring 126 being interrupted at two locations, and the stage 20 has a plastic pad 129 on its lower surface having an outer diameter slightly greater than the outer diameter of the outermost ring 124. When the stage 20 is in place so as to be concentric with the rings, it is held in place by a vacuum pump which is connected to the areas between the inner and outer rings 124 and 128.

To enable a test object to be held securely in place on the stage, the vacuum pump is independently connected to the interior of the innermost ring 128 and the stage 20 preferably has one or more vertical passages formed therethrough extending upwardly from the center of the bottom of the stage to the top surface. The vacuum pump may be temporarily disconnected from the area between the rings 124 and 128 while remaining connected to the interior of ring 128 to enable the stage to be rotated on the stage platform while the test object remains securely held on the stage.

A shallow channel 122 is provided in the stage platform 112 from the forward end thereof to the concentric rings 124, 126, 128 so that the stage 20 may be moved or installed by sliding along the channel 122. The channel 122 has a rounded rear edge 130 curved at a radius corresponding to that of the pad 129 on the bottom of the stage so that when the stage 20 is in place at the rear of the stage platform 112, it will abut the rear edge of the channel and thus give an indication of correct positioning to the operator.

Gravity Constraint

As noted above, gravity constraint is employed rather than structural constraint for certain components of the test station. The X slide is constrained against any motion relative to the X track except for motion parallel to the X axis without the use of any mechanical preloading devices. Gravity provides all necessary preloading for the X slide.

The Y slide is provided with a single mechanical preloading device to provide a single degree of mechanical preload for constraint against movement parallel to the X axis with respect to the Y track, but gravity alone preloads the horizontally-disposed slide pads. Similarly, the horizontally-disposed slide pads on the stage platform and carriage, which support loads parallel to the Z axis, are preloaded entirely by gravity, whereas the vertically-disposed slide pads, which support horizontal loads, are preloaded by mechanical devices. The use of gravity alone to preload the various horizontally-disposed slide pads, and all of the slide pads on the X slide, enable relatively low preloading forces to be maintained without requiring careful adjustment of preloading mechanisms. The preloading mechanisms which are used enable relatively low preloading forces to be employed also. The advantage of providing low preloading forces on the plastic slide pads is the reduction of frictional forces and the resultant increase in smoothness of control and wear life.

The stage is unique in that it is supported on a single slide pad and is constrained entirely by gravity, but the vacuum essentially provides an auxiliary mechanism preload to assist gravity during periods of use. The vacuum thus enables the desirable stabilization of the stage during viewing of a test object thereon, while selectively permitting adjustment of the position of the stage with relative ease.

An additional advantage of the use of gravity constraints as described above is the relatively simple procedures which are available for assembly and disassembly, facilitating maintenance, cleaning, etc.

FIGS. 11-13

Figure 11:
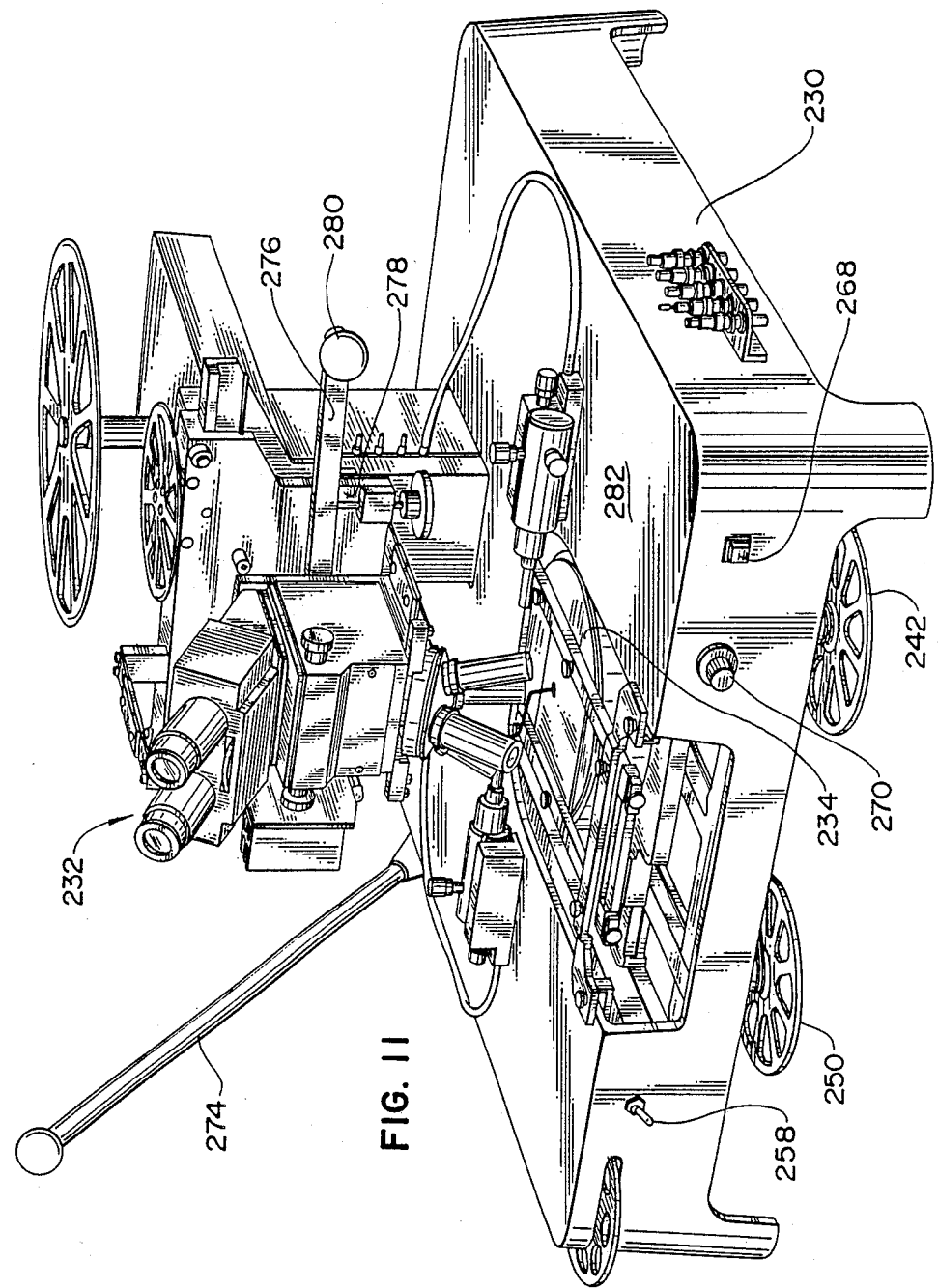
FIG. 11 is a perspective view illustrating a test station in accordance with a second embodiment of the invention.
Figure 12:
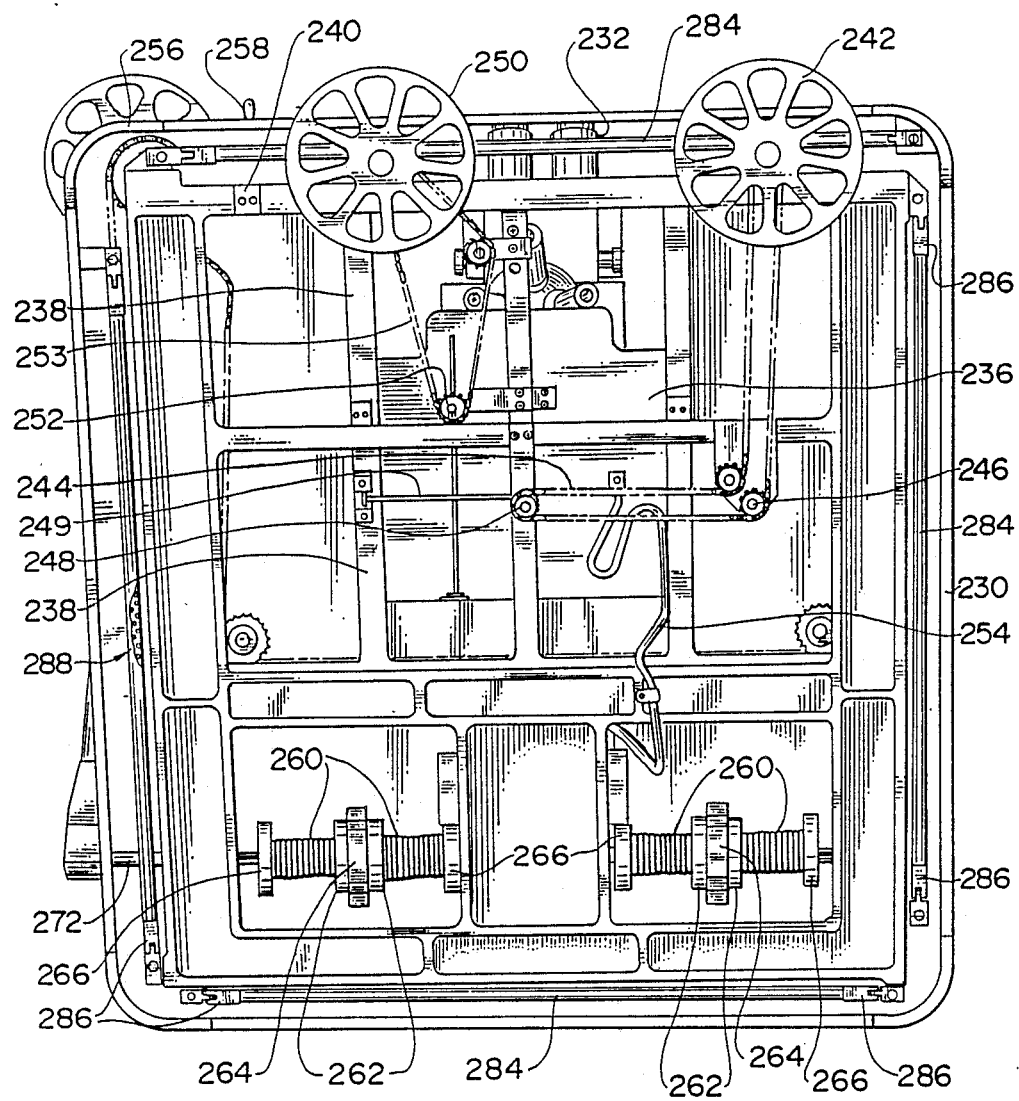
FIG. 12 is a bottom view of the test station of FIG. 11.

FIGS. 11-13 illustrate a second embodiment of the invention, which is functionally identical to the embodiment of FIGS. 1-10 except as noted below. The embodiment of FIGS. 11-13 is considered preferable to that of FIGS. 1-10 with respect to the points noted below.

The test station shown in FIG. 11, like that in FIGS. 1-10, comprises a base 230, a microscope 232 supported above the base, and a stage 234 for supporting an object viewed through the microscope. The stage 234 is supported on a stage platform 236 which is in turn supported on a carriage 238, which is supported on a frame 240 that is movable vertically relative to the base 230. The carriage 238 is movable relative to the frame 240 along the X axis, and the stage platform 236 is movable relative to the carriage 28 along the Y axis.

The carriage 238 is controlled by a first wheel 242 mounted for rotation on the base 230. The wheel 242, as best shown in FIG. 12, drives a chain 244 which extends around guide sprockets 246 to a driven sprocket 248 on a rod drive mounted on the frame 240. The platform 236 is similarly controlled, by a second wheel 250 mounted for rotation on the carriage 238 and connected to a rod drive 252 by a second chain 253.

To selectively apply a vacuum to the stage platform and stage, a tube 254 extends from the bottom of the stage platform to a valve 256 located on the front wall of the base. The valve is controlled by a switch 258, and is connected at its downstream side to a second tube leading to a vacuum pump.

As illustrated in FIG. 13, the front wall of the base has a power switch 268 and illumination control knob 270 also disposed on its front wall, in addition to the vacuum control switch.

As best seen in FIG. 13, quick lifting and lowering of the frame is enabled by a suspension system similar to that described in connection with the embodiment of FIGS. 1-10, comprising a horizontal shaft 272 which is pivoted by a handle 274.

Affixed to the shaft are a pair of drums 290, each having a pair of metal ribbons 292, 294 attached thereto. Each drum 290 has a peripheral surface disposed at a predetermined radius from the axis of the shaft over at least about 180° so that rotation of the shaft effects reeling and unreeling of the ribbons. In each pair of ribbons, one extends vertically downward from the drum to the frame and is attached to the frame; and the other extends horizontally toward the forward end of the test station, over a guide roller, and thence vertically downward to the frame.

Upward biasing of the frame 240 relative to the base 230 is effected through the use of coil springs 260 loaded in torsion. Each of the illustrated springs 260 has one end attached to a collar 262 attached to a lug 264 extending downward from the top wall of the base, and its opposite end connected to a collar 266 fixed to the shaft.

As in the embodiment of FIGS. 1-10, the microscope 232 is supported on a post, which is part of the frame 240, for three dimensional movement relative thereto. Affixed to the top of the post is a Y track, on which is slidably mounted a Y slide. An X track is affixed to the forward end of the Y slide and an X slide is slidably mounted on the X track for rectilinear travel along the X axis. The microscope is supported on the X slide and constrained against horizontal movement relative thereto by three leaf springs.

Coarse vertical or Z-axis movement of the microscope is controlled by a lever arm 276 which is pivotally mounted on the X slide. In the embodiment of FIGS. 11-13, unlike the embodiment of FIGS. 1-10, the microscope 232 is connected to the lever arm between the pivot point and the handle, so that the microscope 232 moves in the same direction as the handle. Thus, when the handle is in its lower position, the microscope 232 is also in its lower position. Fine vertical adjustments of the lower equilibrium position may be made by rotation of a lead screw stop 278 which is vertically adjustable by means of a knob 280.

An advantage of the microscope adjustment mechanism illustrated in FIG. 11 is that it permits convenient positioning of the stop 278 for fine adjustment beneath the handle 274 only a short distance above the top wall of the base 230. This enables the operator of the test station to make fine adjustments with his right hand without moving the right hand a great distance from the micromanipulators on the right-hand side of the test station. This may be significant where one is viewing an object through the microscope 232 and making adjustments to the microscope and the micromanipulators at the same time without looking at the adjustment mechanisms. The adjustment knob for microscope vertical position is preferably disposed close enough to the probe support surface 282 on the right-hand side of the base that the operator can maintain contact with the micromanipulator and the microscope adjustment knob at the same time with one hand, and to this end is within about four inches of the top wall of the base.

The location bars 284 of the embodiment of FIGS. 11-13 are provided with ball joints 286 (best seen in FIG. 12), or self-aligning bearings, at their opposite ends, rather than with flexible leaf springs or the like. Each of the location bars in this embodiment comprises a hollow tube which is loaded between about one-half and two-thirds full with lead shot 288, disposed between the ball joints. The use of these location bars provides an advantage over the first embodiment of the invention described above in that it is less susceptible to vibration and resonance resultant from such vibration. The lead shot performs a damping function, and the ball joints tend to provide greater stability.

As shown in FIG. 13, the stage 234 is movable horizontally relative to the base and is disposed at an elevation beneath the support surface of the base, so that the stage may be disposed partially underneath the support surface. This enables a relatively large stage with a relatively wide range of motion to be employed without restricting the area of the support surface available for mounting of micromanipulators. This feature is also present in the embodiment of FIGS. 1-10.

Except as noted above, and except for minor differences in configuration, the embodiment of FIGS. 11-13 is functionally identical to the embodiment shown in FIGS. 1-10.

From the foregoing, it will be appreciated that the invention described herein provides a novel and improved test station. The invention is not limited to the embodiment described hereinabove or to any particular embodiments.

What is claimed is:

1. A test station comprising:
   a base;
   a movable frame supported by the base and movable relative thereto;
   a microscope supported on said frame;
   means for raising and lowering said frame relative to said base; and
   stabilizing means to permit movement of the frame vertically relative to said base, and preventing horizontal movement of said frame relative to said base;
   said stabilizing means including a plurality of elongate stabilizer bar assemblies, each of which is connected at one end to the frame and at an opposite end to the base, each of said stabilizer bar assemblies being oriented generally horizontally;
   each of said stabilizer bar assemblies comprising a substantially rigid central bar and a pair of movable elements at opposite ends of said substantially rigid control bar;
   said frame having a substantially rectangular, horizontally disposed lower portion having four sides of predetermined lengths, each said stabilizer bar assembly extending parallel to and coextensive with a respective one of said sides, and closely adjacent thereto.

2. A test station in accordance with claim 1 wherein each of said movable elements is a ball joint.

3. A test station in accordance with claim 2 wherein each of said substantially rigid central bars defines an enclosed interior space which is partially loaded with means for damping vibration thereof.

4. A test station comprising:
   a base having a relatively large, generally horizontal upper support surface, said support surface having forward and rearward openings therein;
   a frame supported on said base and including a generally horizontal lower portion disposed substantially beneath said support surface of said base, and an upwardly extending post protruding through said rearward opening in said support surface of said base;
   a microscope supported by said upwardly extending column and extending forward thereof, said microscope having a depending, substantially vertically-oriented optical assembly disposed above said forward opening of said support surface of said base so as to be aligned therewith; and
   a stage supported on said lower portion of said movable frame substantially beneath said microscope so that test objects placed on said stage may be viewed by said microscope.

5. A test station in accordance with claim 4 further comprising a plurality of micromanipulator assemblies supported directly upon said upper surface of said base.

6. A test station in accordance with claim 5 wherein said base further includes four side walls extending downwardly from said upper surface to partially enclose said lower portion of said frame.

7. A test station in accordance with claim 6 wherein said base consists of a single, integral finished casting, and said stage is disposed at an elevation lower than that of said support surface so that said stage may be positioned partially beneath said support surface.

8. A test station in accordance with claim 7 wherein said four side walls of said base include a forward side wall and a rear side wall opposite thereto, and wherein said forward side wall has an opening therein disposed contiguous with the forward opening in the upper support surface of the base to facilitate installation and removal of said stage.

9. A test station comprising:
   a base;
   a microscope supported for three-dimensional movement with respect to said base;
   means for adjusting the vertical position of said microscope relative to said base; and
   means for adjusting the horizontal position of
   to said base comprising a first said microscope relative track supported so as to be in a fixed position relative to said base during adjustment of the horizontal position of said microscope; a first slide supported by said first track for rectilinear motion relative thereto along a first predetermined horizontal axis; a first elongated rod fixedly supported on said track and disposed parallel to said first predetermined horizontal axis; a first friction wheel rotatably mounted on said slide and having an annular peripheral surface frictionally engaging said rod; and means to enable manual rotation of said friction wheel; whereby rotation of said first friction wheel effects relative motion between said first friction wheel and said first rod along said first predetermined horizontal axis, thereby effecting corresponding relative motion between said first track and said first slide along said first predetermined horizontal axis.

10. A test station in accordance with claim 9 further comprising a second track fixed to said first slide; a second slide supported by and slidable in rectilinear motion relative to said second track along a second predetermined horizontal axis perpendicular to said first predetermined horizontal axis; a second elongated rod fixed to said second track and extending parallel to said second predetermined axis; a second friction wheel rotatably supported on said second slide and having an annular peripheral surface frictionally engaging said second elongated rod; and means to enable manual rotation of said second friction wheel; whereby rotation of said second friction wheel effects relative movement between said second friction wheel and said second rod, thereby effecting relative movement between said second slide and said second track along said second predetermined horizontal axis.

11. A test station comprising:
    a base;
    a microscope;
    means for supporting said microscope above said base for three dimensional movement relative to said
    a stage for supporting objects to be viewed by said microscope;
    means for supporting said stage for three dimensional movement relative to said base;
    control means for adjusting the position of said microscope; and
    control means for adjusting the position of said stage;
    each of said means for supporting said stage and said microscope comprising:

a first member which is supported by said base and constrained against horizontal movement;

a second member which is movable only in rectilinear horizontal travel relative to said first member along a first axis;

a third member movable only in rectilinear travel relative to said second member along a second axis; and a plurality of linear bearings for supporting said third member on said second member, and supporting said second member on said first member;

each of said linear bearings comprising a slide pad having a substantially planar bearing surface thereon and a substantially cylindrical peripheral surface.

12. A test station in accordance with claim 11 wherein each of said linear bearings is made of graphite-filled Teflon.

13. A test station in accordance with claim 11 wherein said control means for adjusting the position of said microscope and said control means for adjusting the position of said stage each comprise rod drives for effecting relative horizontal movement thereof;

each said rod drive comprising a rod disposed on one of said members and means for engaging said rod in rolling contact disposed on another of said members;

said means for engaging said rod in rolling contact comprising a pair of rollers disposed on opposite sides of said rods, at least one of said rollers having a groove therein for frictionally engaging said rod; said groove defining an included angle of about 15°.

14. A test station comprising:

a base;

a movable frame supported on said base for rectilinear vertical motion;

a microscope supported on said frame;

a stage supported on said frame; and means for effecting rectilinear vertical motion of said frame so that said microscope and said stage can be moved in said rectilinear vertical motion without movement relative to one another, thereby permitting said frame to be moved vertically relative to said objects on said base while objects supported on the stage remain in focus for purposes of viewing through said microscope during said rectilinear motion of said frame.

15. A test station in accordance with claim 14 wherein said means for effecting rectilinear vertical motion of said frame comprises a shaft rotatably mounted on said base;

means for rotating said shaft about said horizontal axis;

at least two drums disposed on said shaft and affixed thereto;

at least three elongated flexible members loaded in tension, three roller chains, each of said members having a first end connected to a respective one of said drums and a second end connected to said frame;

at least one guide roller sprocket rotatably supported on said base;

at least one of said members extending generally horizontally from its respective associated drum over said at least one idler sprocket and thence vertically downward to said frame, said three members being connected to said frame at non-colinear locations; and at least three stops fixed to said base for limiting vertical travel of said frame.

16. A test station in accordance with claim 15 further comprising biasing means for biasing said shaft in a predetermined rotational direction.

17. A test station in accordance with claim 14 wherein said frame is constrained on said base by a plurality of elongated stabilizer bar assemblies which permit rectilinear vertical travel of said frame but constrain said frame against horizontal movement and against rotation about its vertical axis.

* * * * *

UNITED STATES PATENT AND TRADEMARK OFFICE
CERTIFICATE OF CORRECTION

PATENT NO. : 4,893,914

DATED : January 16, 1990

INVENTOR(S) : Robert D. Hancock; Kenneth F. Hollman; Gene A. Porter

It is certified that error appears in the above-identified patent and that said Letters Patent is hereby corrected as shown below:

Column 1, line 50, after "to" delete "interfere with".

Column 1, line 51, after "and" insert --interfere with--.

Column 6, line 3, between "left" and "forward" insert a hyphen.

Column 8, line 7, change "rack" to --track--.

Column 14, line 17, after "of" insert --said microscope relative--.

Column 14, lines 18-19, after "first" delete phrase "said microscope relative".

Column 14, line 59, after "said" insert --base;--.

Signed and Sealed this

Second Day of July, 1991

Attest:

Attesting Officer

HARRY F. MANBECK, JR.

Commissioner of Patents and Trademarks